(12) United States Patent
Matschl

(10) Patent No.: US 9,945,916 B2
(45) Date of Patent: Apr. 17, 2018

(54) TEMPERATURE MONITORING OF LOCAL COILS

(71) Applicant: Volker Matschl, Bamberg (DE)

(72) Inventor: Volker Matschl, Bamberg (DE)

(73) Assignee: Siemens Aktiengesellschaft, München (DE)

( * ) Notice: Subject to any disclaimer, the term of this patent is extended or adjusted under 35 U.S.C. 154(b) by 870 days.

(21) Appl. No.: 14/450,237

(22) Filed: Aug. 2, 2014

(65) Prior Publication Data

US 2015/0035534 A1    Feb. 5, 2015

(30) Foreign Application Priority Data

Aug. 2, 2013  (DE) .................. 10 2013 215 226

(51) Int. Cl.
*G01R 33/34* (2006.01)
*G01R 33/28* (2006.01)
*G01R 33/36* (2006.01)

(52) U.S. Cl.
CPC ...... *G01R 33/34015* (2013.01); *G01R 33/288* (2013.01); *G01R 33/3692* (2013.01)

(58) Field of Classification Search
CPC .............. G01R 33/288; G01R 33/3692; G01R 33/34015
See application file for complete search history.

(56) References Cited

U.S. PATENT DOCUMENTS

| | | | | |
|---|---|---|---|---|
| 7,622,921 B2 * | 11/2009 | Fontius | .............. | G01R 33/3415 324/307 |
| 8,099,059 B2 * | 1/2012 | Graesslin | ........... | G01R 33/3415 324/318 |
| 8,901,928 B2 * | 12/2014 | Alexiuk | ............... | G01R 33/288 324/318 |
| 9,001,965 B2 * | 4/2015 | Lautenschlager | ...... | A61B 6/032 378/19 |
| 2005/0127914 A1 | 6/2005 | Eberler et al. | | |
| 2006/0232275 A1 | 10/2006 | Leussler | | |
| 2008/0309342 A1 | 12/2008 | Kess | | |

FOREIGN PATENT DOCUMENTS

| | | |
|---|---|---|
| DE | 10314215 B4 | 11/2006 |
| DE | 102007026915 A1 | 1/2009 |

OTHER PUBLICATIONS

German Office Action dated Jan. 24, 2014 for corresponding DE 10 2013 215 226.4 with English translation.

* cited by examiner

*Primary Examiner* — Dixomara Vargas
(74) *Attorney, Agent, or Firm* — Lempia Summerfield Katz LLC

(57) ABSTRACT

A device for a magnetic resonance imaging system includes a warning signal apparatus configured to emit a warning signal when a limit value is exceeded by a current induced in the device by radiofrequency signals of a magnetic resonance imaging system.

26 Claims, 2 Drawing Sheets

TEMPERATURE MONITORING OF LOCAL COILS

This application claims the benefit of DE 10 2013 215 226.4, filed on Aug. 2, 2013, which is hereby incorporated by reference in its entirety.

BACKGROUND

The present embodiments relate to local coils for a magnetic resonance imaging system and a method.

Magnetic resonance devices (MRIs) for examining objects or patients by magnetic resonance imaging are known from, for example, DE 103 14 215 B4.

SUMMARY

The scope of the present invention is defined solely by the appended claims and is not affected to any degree by the statements within this summary.

The present embodiments may obviate one or more of the drawbacks or limitations in the related art. For example, magnetic resonance imaging is optimized.

DETAILED DESCRIPTION

Figure 2:
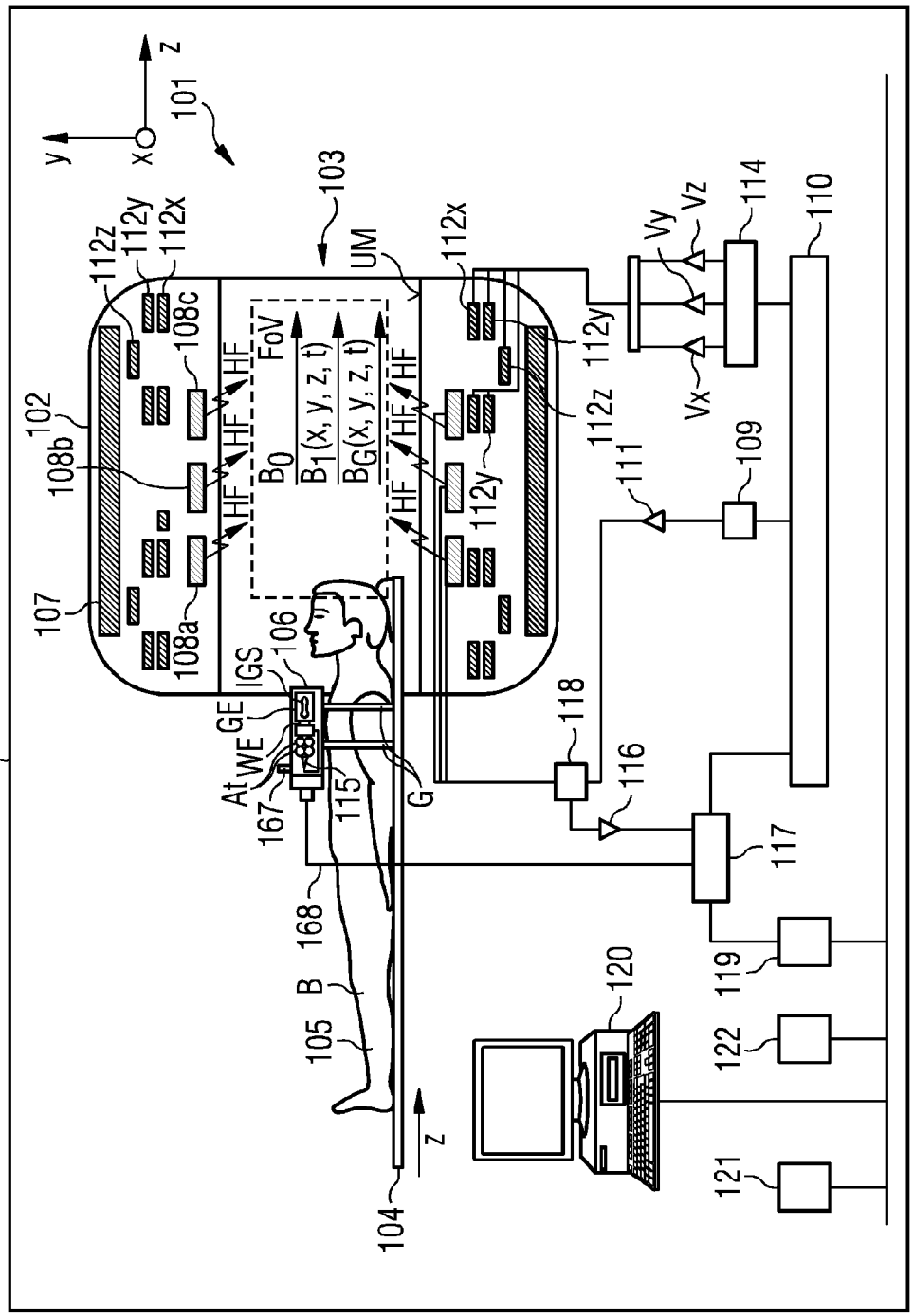
FIG. 2 shows one embodiment of an MRI system with a local coil.

FIG. 2 shows one embodiment of a magnetic resonance imaging device MRI 101 (e.g., situated in a shielded room or Faraday cage F) with a whole body coil 102 with, for example, a tubular space 103 in which a patient couch 104 with a body of, for example, an examination object 105 (e.g., of a patient; with or without local coil arrangement 106) may be displaced in the direction of the arrow z in order to generate recordings of the patient 105 by an imaging method. In this case, a local coil arrangement 106 is arranged on the patient. Using the local coil arrangement, in a local region (e.g., as field of view or FOV) of the MRI, recordings of a portion of interest (e.g., ROI) of the body 105 in the FOV may be generated. Signals of the local coil arrangement 106, which may be amplified 115 may, possibly after further amplification, be evaluated (e.g., converted into images, stored or displayed) by an evaluation device (e.g., including elements 168, 117, 119, 120, 121, etc.) of the MRI 101, which may be connected to the local coil arrangement 106 by, for example, coaxial cables (e.g., element 168) and/or by radio link (e.g., element 167), etc.

In order to use a magnetic resonance imaging device MRI 101 to examine a body 105 (e.g., an examination object or a patient) using magnetic resonance imaging, different magnetic fields, which are precisely matched to one another in terms of temporal and spatial characteristics, are radiated onto the body 105. A strong magnet (e.g., a cryomagnet 107) in a measurement cabin with an opening 103 that is tunnel-shaped in this case generates a strong static main magnetic field $B_0$, which has a strength of, for example, 0.2 Tesla to 7.5 Tesla or even more. A body 105 to be examined is, while supported on a patient couch 104, driven into a region of the main magnetic field B0, which is approximately homogeneous in the observation region FOV. The nuclear spins of atomic nuclei of the body 105 are excited by magnetic radiofrequency excitation pulses B1(x, y, z, t) that are radiated in as RF by a radiofrequency antenna and/or, optionally, a local coil arrangement that is depicted in a much simplified manner as body coil 108 (e.g., multi-part body coil 108a, 108b, 108c). By way of example, radiofrequency excitation pulses B1(x, y, z, t), RF are generated by a pulse generation unit 109, which is controlled by a pulse sequence control unit 110. After amplification by a radiofrequency amplifier 111, the radiofrequency excitation pulses B1(x, y, z, t) are conducted to the radiofrequency antenna 108. The radiofrequency system shown is merely indicated schematically. In a magnetic resonance device 101, more than one pulse generation unit 109, more than one radiofrequency amplifier 111 and a plurality of radiofrequency antennas 108a, b, c may be used.

The magnetic resonance device 101 also includes gradient coils 112x, 112y, 112z, by which magnetic gradient fields $B_G$ (x, y, z, t) are radiated in during a measurement for selective slice excitation and for spatial encoding of the measurement signal. The gradient coils 112x, 112y, 112z are controlled by a gradient coil control unit 114 and optionally via amplifiers Vx, Vy, Vz. Like the pulse generation unit 109, the gradient coil control unit 114 is connected to the pulse sequence control unit 110.

Signals emitted by the excited nuclear spins of the atomic nuclei in the examination object are received by the body coil 108 and/or at least one local coil arrangement 106, amplified by associated radiofrequency preamplifiers 116 and processed further and digitized by a reception unit 117. The recorded measurement data are digitized and stored as complex numbers in a k-space matrix. An associated MR image may be reconstructed from the k-space matrix filled with values by a multidimensional Fourier transform.

For a coil that may be operated both in transmission mode and in reception mode, such as, for example, the body coil 108 or a local coil 106, the correct signal transmission is regulated by an upstream transmission/reception switch 118.

An image processing unit 119 generates an image from the measurement data. The image is displayed to a user by an operating console 120 and/or stored in a storage unit 121. A central computer unit 122 controls the individual installation components.

In MR imaging, images with a high signal-to-noise ratio (SNR) may be recorded using local coil arrangements (e.g., coils, local coils). These are antenna systems that are attached in the direct vicinity on (e.g., anterior), under (e.g., posterior), at, or in the body 105. During an MR measurement, the excited nuclei induce a voltage in the individual antennas At of the local coil. The induced voltage is then amplified using a low-noise preamplifier (e.g., LNA, preamp) and transmitted to the reception electronics. In order to improve the signal-to-noise ratio even in the case of high resolution images, high-field installations (e.g., 1.5 T-12 T or more) are used. If more individual antennas may be connected to an MR reception system than receivers are available, a switching matrix (e.g., RCCS), for example, is installed between reception antennas and receivers. The matrix routes the currently active reception channels (e.g., reception channels that currently lie in the field of view of the magnet) to the available receivers. As a result, more coil elements than receivers are available may be connected because, in the case of a whole body cover, only the coils that are situated in the FoV or in the homogeneous volume of the magnet may be read out.

By way of example, an antenna system that may, for example, include one antenna element or, as an array coil, a plurality of antenna elements (e.g., coil elements) may be referred to as local coil arrangement 106. By way of example, these individual antenna elements At are embodied as loop antennas (e.g., loops), butterfly coils, flex coils or saddle coils. By way of example, a local coil arrangement includes coil elements, a preamplifier, further electronics (e.g., standing wave traps, etc.), a housing, supports and may include a cable with plug, by which the local coil arrangement is connected to the MRI installation. A receiver 168 attached to the installation side filters and digitizes a signal received from a local coil 106 (e.g., by radio link, etc.) and transmits the data to a digital signal processing device. The digital signal processing device may derive an image or a spectrum from the data obtained by a measurement and makes this available to the user, for example, for the subsequent diagnosis by the user and/or for storing.

Figure 1:
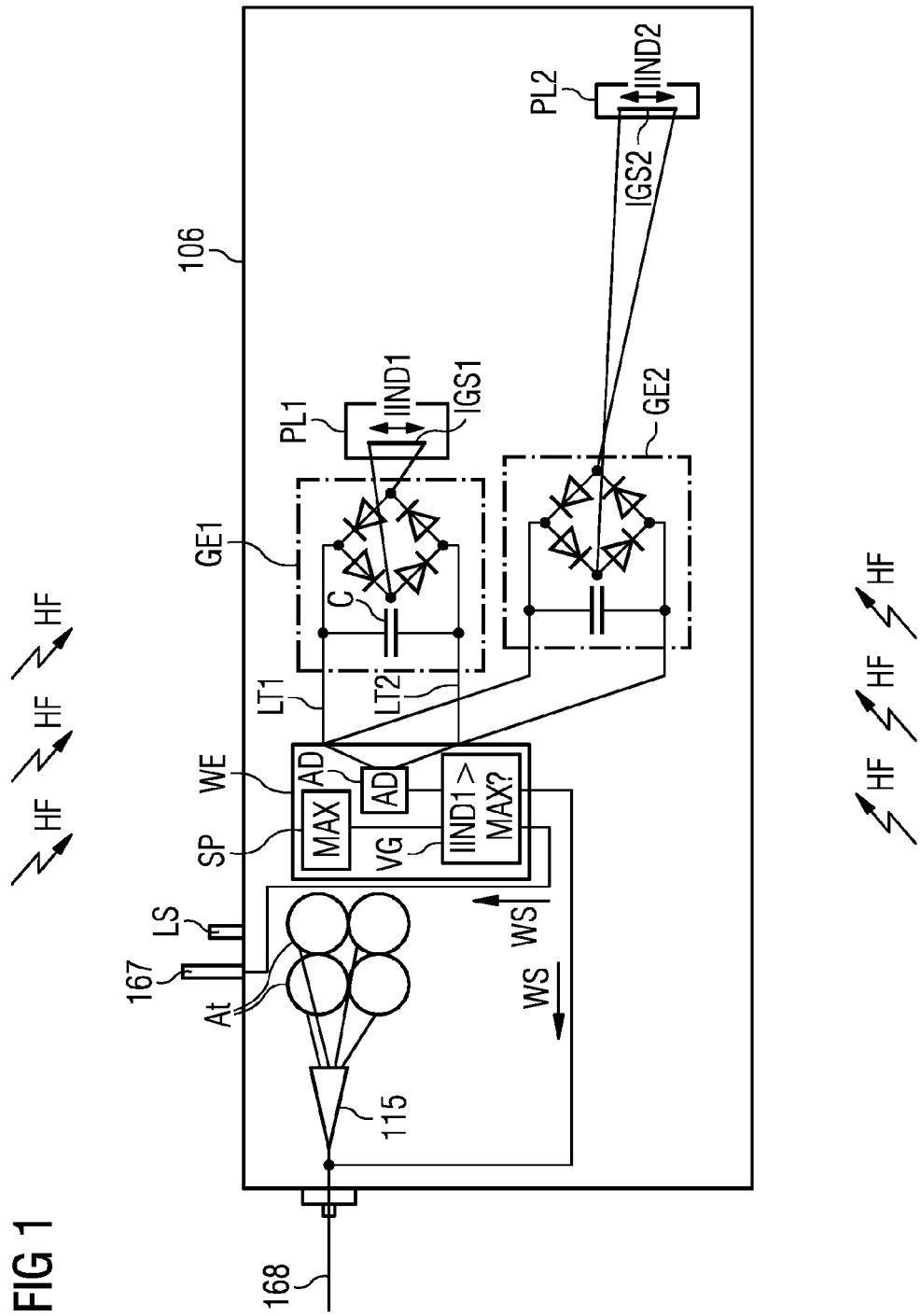
FIG. 1 shows one embodiment of a local coil.

FIGS. 1 and 2 highlight details of exemplary embodiments.

In the following text, a type of early warning system is described. The early warning system is able to provide a warning if a current IIND1, IIND2 induced in an MRI system component (e.g., device 106) in the MR bore 103 (e.g., in a local coil 106), and/or the temperature exceed(s) a critical value MAX. A type of self protection of a component (e.g., in view of two-channel, eight-channel or multi-channel (local coil) transmission systems (=TX systems)), in which monitoring or the component protection may be specific, is advantageous. RF currents IIND1, IIND2 induced on conductive structures of a device (e.g., a local coil 106) may generate heating, for example, directly over the parts of a local coil 106, and therefore heating of the housing surface of, for example, a local coil 106, or indirectly in the human body via dielectric displacement currents.

Therefore, according to known solutions, fuses in the local coils 106 were previously used directly in a resonant circuit of the local coil. According to known solutions, a redundancy of sheath wave chokes in the feed lines of the local coil may also be provided. There are known component protection models that are able to calculate the applied power and therefore restrict the system 101 by, for example, the complete S-parameter set of the body coil 102 and/or coil power losses from the forward and reflected wave of the radiofrequency power amplifier (RFPA).

According to an embodiment that may be used as an alternative or in addition hereto, there may be an emission (e.g., a wireless emission) of a warning signal WS (e.g., either acoustically LS like in the case of an alarm of a wristwatch or using a transmission apparatus 167 in the GHz-range) fed by the rectification of induced RF currents IIND1, IIND2 on conductors IGS1, IGS2 of, for example, a local coil 106 through which a current flows. Alternatively, a warning signal apparatus may be provided with power by, for example, a source of energy such as, for example, a battery in the local coil, or by a power supply of the local coil by a feed line. By way of example, RF currents IIND1, IIND2 may be rectified similar to the known principle of auto-powering of an active detuning circuit of MR local coils 106.

An advantage of embodiments may be that this may be an autonomous (e.g., further autonomous), independent system (e.g., like in the case of sheath wave chokes) that may also operate if the local coil 106 is not plugged in (e.g., on a connector of a patient couch 104 and/or of an MRI device 101).

Temperature monitoring in the plugged case (e.g., if a device such as a local coil 106 is plugged into a connector on a patient couch of the MRI device 101), which may currently be sufficient in the case of a known IEC60601 third edition, may also be provided with a separate signal line (e.g., in element 168). Detection modules may be queried via a ring connection or I2C in the sequence pauses (e.g., of RF pulse sequences), where EC heating may also be detected.

A possible omission of a fuse, which is intended to cover the second aforementioned error source, may be possible. Alternatively, monitoring or the component protection may be wholly or partly assumed by an embodiment. The first error source may cover, for example, a passive detuning circuit in the actual resonant circuit (e.g., of an antenna At) of a local coil 106 and/or cover a second sheath wave choke in the feed line 168 (e.g., of a local coil 106), which may still provide reliable operation if the first sheath wave choke fails. A fuse may cause deterioration in the signal-to-noise ratio (SNR) since the fuse may constitute an additional ohmic resistor in the resonant circuit of an antenna At. It may be difficult to realize these fuses in feed lines 168 of a local coil 106 since currents may flow on the outer sheath of the feed lines 168 and, to this end, the shielding braid may have to be interrupted. This may lead to signal crosstalk, coupling or feedback and may therefore increase the tendency of the preamplifiers to vibrate.

In the case of temperature monitoring, only long-term effects may be monitored (e.g., observed), for example, in the sequence pauses (e.g., of a pulse sequence), so that no disturbing gradients (e.g., pulses) or RF pulses are applied during the readout process.

Inductively coupled circuits (e.g., lines in printed circuit boards PL1, PL2 and/or antennas At) may withdraw the required energy for transmitting a warning signal WS in the sequence transmission pauses or reception phases of the local coil from capacities (e.g., capacitors C) charged during the transmission phase (e.g., in sequences). The warning apparatus circuit WE itself may also operate with corresponding time-lag so that the measured value (e.g., of an induced current IIND1, IIND2) is still present during one or more MRI RF sequence transmission pauses (e.g., between or within sequences).

Critical points of a local coil 106 (e.g., with respect to currents IIND1, IIND2 induced by RF of the MRI device and/or heating) may be found, for example, in the MRI device with the aid of a thermal imaging camera, and the local coil 106 may be equipped at these points with appropriate sensors IGS1, IGS2, PL1, PL2 by inductively coupled circuits or by a temperature sensor.

Conductors IGS1, IGS2 (e.g., in which currents IIND1, IIND2 are induced by RF signals HF of the MRI device 101; the currents IIND1, IIND2 may be used as criterion and energy supply for generating a warning signal WS) may be formed as flexible circuit board(s) PL1, PL2, that may be adhesively bonded or placed at, for example, critical points (e.g., at which current maxima occur in a local coil 106) between two sheath wave chokes or two detuning circuits.

In the feed lines 168 of a local coil 106, the E-fields may be critical, and the B-fields may be critical in the loops (e.g., antennas At), even though, in this case too, it is disadvantageously possible for E-fields to be induced between two detuning circuits.

In detail, FIG. 1 shows, as an example and in a schematic and simplified manner, a local coil 106 with some antennas At (e.g., a plurality of antennas At). Received RF signals of the antennas At may, for evaluation purposes, be transmitted by radio 167 or by wires 168 to a control unit (e.g., element 117) of an MRI device (e.g., element 101) for further evaluation.

In this case, a warning signal apparatus WE, which is supplied with energy from a rectification apparatus GE that is configured for rectifying currents IIND1, IIND2 induced by radiofrequency signals HF of a magnetic resonance imaging system 101, 108*a-c*, is depicted for detecting (e.g., with respect to the magnitude) current or currents IIND1, IIND2 (e.g., in each case on one printed circuit board PL1, PL2 at a plurality of points in the local coil 106). The current or currents IIND1, IIND2 is/are induced by RF signals HF of the MRI device 101 in a conductor IIND1, IIND2 and lie over a limit value MAX (e.g., stored in a storage medium SP in the local coil 106).

By way of example, a rectification apparatus GE1, GE2, like in FIG. 1, may use diodes for rectification purposes and may include, for example, a capacitor C as an energy store.

By way of example, the warning signal apparatus WE may use a comparison apparatus VG to compare digitized (AD) current or currents IIND1, IIND2, that are received in a rectified manner by a rectification apparatus GE1, GE2 to a limit value MAX stored in a storage medium SP. If the limit value MAX is exceeded, the warning signal apparatus WE may output a warning signal WS in the form of an acoustic output via a loudspeaker LS (e.g., a piezo-loudspeaker) and/or transmit the warning signal via a radio device 167 to a control unit of an MRI device 101 and/or transmit the warning signal in a wired manner (e.g., by a coaxial cable 168) to a control unit of an MRI device 101.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for a magnetic resonance imaging system, the device comprising:
a warning signal apparatus that is configured to emit a warning signal when a limit value is exceeded by a current induced in the device by radiofrequency signals of the magnetic resonance imaging system;
at least one rectification apparatus configured to rectify the current induced in the device by the radiofrequency signals of the magnetic resonance imaging system, wherein the at least one rectification apparatus is connected to the warning signal apparatus for supplying current to the warning signal apparatus in the device; and
at least one capacitive element configured to store energy from the induced current rectified by the at least one rectification apparatus, wherein a capacitive element of the at least one capacitive elements is configured for providing energy stored in the capacitive element to the warning signal apparatus of the device.

2. The device of claim 1, further comprising a radio apparatus provided on the device for wireless emission of the warning signal.

3. The device of claim 2, wherein the radio apparatus comprises a radio apparatus configured for transmitting the warning signal in the GHz-range, a radio apparatus fed by the at least one rectification apparatus, or a further rectification apparatus for rectifying the current induced in the device by the radiofrequency signals of the magnetic resonance imaging system.

4. The device of claim 1, wherein an acoustic output of the warning signal by a loudspeaker is provided for wireless emission of the warning signal.

5. The device of claim 4, wherein the loudspeaker is a loudspeaker on the device.

6. The device of claim 1, wherein a conductive connection between the device and a control unit of the magnetic resonance imaging system is provided for cable-based emission of the warning signal.

7. The device of claim 1, further comprising conductors in the device, the induced current flowing through the conductors in each case.

8. The device of claim 1, further comprising conductors in one or more detection modules in the device, the induced current flowing through the conductors in each case.

9. The device of claim 1, wherein the warning signal apparatus is configured to ensure that the warning signal is only emitted when a stored limit value is exceeded by a magnitude of induced current over a minimum period of time.

10. The device of claim 9, wherein the minimum period of time is more than 0.1 seconds, 0.01 seconds, or 0.001 seconds.

11. The device of claim 1, wherein the warning signal apparatus is configured to ensure that a limit value being exceeded by a magnitude of the induced current is only monitored, reported, or monitored and reported during sequence pauses of the magnetic resonance imaging system, for only measuring induced current outside of sequence pauses, for only transmitting a warning signal outside of sequence pauses, or any combination thereof.

12. The device of claim 11, wherein the warning signal apparatus is configured to ensure that the limit value being exceeded by a magnitude of the induced current is only monitored, reported, or monitored and reported during the sequence pauses of the magnetic resonance imaging system by virtue of the warning signal apparatus being configured for switching, such that conductors provided for measuring the induced current in the device are non-conductive.

13. The device of claim 1, wherein the capacitive element is configured for providing energy stored in the capacitive element to the warning signal apparatus of the device during an analysis of the induced current, the emission of the warning signal, or any combination thereof.

14. The device of claim 1, wherein the capacitive element is configured for providing energy stored in the capacitive element to the warning signal apparatus of the device during an analysis of induced currents, the emission of the warning signal, or any combination thereof when the magnetic resonance imaging system is not transmitting any radiofrequency signals.

15. The device of claim 1, wherein the at least one rectification apparatus for rectifying the current induced in the device by the radiofrequency signals of the magnetic resonance imaging system comprises conductors in one or more detection modules of the device, through which the induced currents flow, and wherein the conductors are arranged in a region of a strongest induction of currents by the radiofrequency signals.

16. The device of claim 1, further comprising one or more conductors on at least one circuit board.

17. The device of claim 1, further comprising conductors at points in the device at which current maxima occur, between two sheath wave chokes, between two detuning circuits, or any combination thereof.

18. The device of claim 1, further comprising conductors adhesively bonded on the device.

19. The device of claim 1, further comprising conductors within or in the form of feed lines of the device.

20. The device of claim 1, wherein conductors of the device, through which induced currents flow and for the rectification of which the at least one rectification apparatus is provided, are arranged outside of a resonant circuit of an antenna or antennas of the device.

21. The device of claim 1, wherein the at least one rectification apparatus, the warning signal apparatus, or a combination thereof is arranged in the device.

22. The device of claim 1, wherein the device is a local coil for a magnetic resonance imaging (MRI) device.

23. The device of claim 1, wherein the device is a two-channel, eight-channel or multi-channel local coil.

24. The device of claim 1, further comprising at least two rectification apparatuses configured to rectify the current induced in the device by the radiofrequency signals of the magnetic resonance imaging system.

25. A method for monitoring a device for a magnetic resonance imaging system, the method comprising:
emitting, by a warning signal apparatus, a warning signal when a limit value is exceeded by a current induced in the device by radiofrequency signals of a magnetic resonance imaging system;
rectifying, by at least one rectification apparatus, the current induced in the device by the radiofrequency signals of the magnetic resonance imaging system, wherein the at least one rectification apparatus is connected to the warning signal apparatus for supplying current to the warning signal apparatus in the device; and
storing, by at least one capacitive element, energy from the induced current rectified by the at least one rectification apparatus, wherein a capacitive element of the at least one capacitive elements is configured for providing energy stored in the capacitive element to the warning signal apparatus of the device.

26. A device for a magnetic resonance imaging system, the device comprising:
a warning signal apparatus that is configured to emit a warning signal when a limit value is exceeded by a current induced in the device by radiofrequency signals of the magnetic resonance imaging system;
at least one rectification apparatus configured to rectify the current induced in the device by the radiofrequency signals of the magnetic resonance imaging system, wherein the at least one rectification apparatus is connected to the warning signal apparatus for supplying current to the warning signal apparatus in the device; and
at least one capacitive element configured to store energy from the current induced in the device by the radiofrequency signals of the magnetic resonance imaging system and subsequently rectified by the at least one rectification apparatus, wherein a capacitive element of the at least one capacitive element is configured for providing energy stored in the capacitive element to the warning signal apparatus of the device.

* * * * *